(12) United States Patent
Coughlin, Jr. et al.

(10) Patent No.: US 6,262,599 B1
(45) Date of Patent: Jul. 17, 2001

(54) LEVEL SHIFTING CMOS I/O BUFFER

(75) Inventors: Terry C. Coughlin, Jr., Endicott; William F. Lawson, Vestal; Joseph M. Milewski, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/544,132

(22) Filed: Apr. 6, 2000

(51) Int. Cl.[7] .......................... H03K 19/0175; H03L 5/00
(52) U.S. Cl. ................... 326/81; 326/80; 326/68; 327/333
(58) Field of Search ..................... 326/62, 68, 80, 326/81, 83; 327/333

(56) References Cited

U.S. PATENT DOCUMENTS

| | | |
|---|---|---|
| 4,540,904 | 9/1985 | Ennis et al. . |
| 5,300,835 | 4/1994 | Assar et al. . |
| 5,378,943 | 1/1995 | Dennard . |
| 5,506,535 | 4/1996 | Ratner . |
| 5,777,944 | 7/1998 | Knaack et al. . |
| 5,969,554 | 10/1999 | Chan et al. . |
| 5,990,705 | 11/1999 | Lim . |
| 6,040,715 | * 3/2000 | Kang et al. ............... 326/87 |
| 6,043,698 | * 3/2000 | Hill ............................ 327/333 |
| 6,097,214 | * 8/2000 | Troussel et al. .......... 326/63 |
| 6,107,832 | * 8/2000 | Taniguchi ................. 326/81 |

OTHER PUBLICATIONS

Microelectronic Circuits And Devices, Mark N. Horenstein, 1996 by Printice–Hall, Inc. p. 354.*

* cited by examiner

Primary Examiner—Michael Tokar
Assistant Examiner—Vibol Tan
(74) Attorney, Agent, or Firm—Schmeiser, Olsen & Watts; John R. Pivnichny

(57) ABSTRACT

A low power CMOS bidirectional I/O buffer that translates low voltage core logic level signals into the higher voltage logic level signals. A first predrive stage is provided, comprising buffers (e.g., CMOS inverters) for tuning and balancing the circuit and the core signal combining circuit of a second predrive stage, thereby enabling IC designers to reduce the size of transistors in the level-shifting stage and providing more flexibility in the tuning of the predrive circuitry to synchronize or balance the logical transitions of the complementary transistors of the output driving stage. The invention provides a faster balanced level-shifting output buffer which enables higher frequency operation.

20 Claims, 6 Drawing Sheets

LEVEL SHIFTING CMOS I/O BUFFER

BACKGROUND OF THE INVENTION

1. Technical field

The present invention relates generally to the field of integrated circuit design, particularly to the design of Integrated Circuits (ICs), and Application Specific Integrated Circuit (ASICs), in a system with plural or "mixed" DC voltage supplies.

2. Related Art

The field of low power integrated circuitry is a rapidly developing field of technology. Integrated circuits are continually being made smaller while simultaneously increasing both device speed and circuit density. The miniaturized devices built within and upon a semiconductor substrate are spaced very closely together and the integrated circuit density, that is, the number of transistor elements per unit of surface area, continues to increase significantly. The highest integrated circuit density is currently achieved using Field Effect Transistors (FETs).

A FET is a semiconductor device having a source, gate, and drain arranged such that when a high logic signal voltage is applied to the gate, current may pass from the source to the drain, and the voltage difference between the source and the drain approaches zero. Conversely, the FET does not allow current to pass between the source and the drain when a low logic signal voltage is applied to the transistor's gate. Complementary metal oxide semiconductor (CMOS) circuit elements further limit current usage by employing two complementary FETs (NFET and PFET) arranged gate-to-gate between the voltage supply and ground, which stops the flow of current during operation except during momentary transitions between logical states. The shorter the time that each such logical transition takes, the less current, hence power, is consumed. Therefore, power consumption and heat generation can be reduced by designing CMOS elements to "switch" states in the least amount of time possible. The length of time to require to switch a given transistor from one logical state to the other depends on both the internal characteristics of the transistor and upon the properties of the circuit that drives the gate of the transistor.

A CMOS transistor's gate operates in tandem with a parallel back-gate in a manner similar to a capacitor having a metal oxide dielectric. The larger the transistor is, the larger the area of its gate is, and the more capacitance it has. The more capacitance a transistor has, the more time it will take to "fill up" the capacitance at its gate with electric current from a given driving circuit. Similarly, the more capacitance the transistor has, the longer it will take to discharge to ground the charge stored at its gate. Therefore, smaller CMOS transistor elements are generally faster than larger CMOS transistor elements. It follows that smaller CMOS transistor elements generally consume less electrical power, and generate less heat, than larger CMOS transistor elements, and for this reason, as is more thoroughly explained below, smaller elements are generally preferred where they are otherwise functionally adequate. However, the smaller a given CMOS transistor is, the slower it will be able to fill (or empty) the gate capacitance of the next CMOS transistor or transistors which it drives. Therefore, large transistors are generally required to drive large transistors, and small transistors are generally adequate only to drive small transistors.

Generally, the fastest CMOS circuits are those which are designed to perform the required logical operation with the smallest transistors and with the fewest number of transistor elements. In designing integrated circuits, the size of a given transistor performing a particular function is generally reduced until its function would become impaired. If a given transistor can be eliminated from a known circuit design entirely without impairing the circuit's operation, that ultimate reduction of transistor size is generally considered to be an improvement in the design. In general, the more transistor elements there are in the path of a given signal, the slower that signal will propagate through the circuit to its destination, and the more power will be consumed. The necessity for level-shifting output buffers is generally due to a relentless pursuit by circuit designers of reductions of power consumption, which also may be accomplished by lowering the operating voltage applied to the transistors in the core logic, as is more thoroughly explained below.

Power consumption in electronic devices can be approximated by the equation P=VI (i.e., Power "P"=Voltage "V" times Current "I"). Power consumption is equal to the value of the DC supply voltage (e.g., "Vdd") multiplied by the amount of current (e.g., "I") flowing from the supply through the circuit's transistors. At any given moment in time, total current "I" consumed by a chip is generally equal to the sum of the smaller currents flowing through the numerous transistors and other circuit elements on the IC. The power consumed by a circuit in operation is transformed into heat within the circuit, which then must be continually dissipated in order to avoid thermal breakdown and failure of the circuit.

As the integrated circuit density on a chip increases, the amount of power consumed and heat generated per unit of area by the integrated circuits on the substrate increases proportionally. The integrated circuit industry has changed from TTL to CMOS in order to decrease the current consumption, thereby reducing power consumption and heat generation.

In digital CMOS systems, power consumption increases approximately proportionally with the frequency of the switching operation of the circuit. However, the minimum frequency of switching operation is usually constrained by logical and performance requirements and therefore reduction of switching frequency is not always available as a way to reduce power consumption.

To further decrease power consumption, and therefore heat generation, it is desirable that the operating voltage be reduced. Power consumption can be decreased by lowering the voltage supply (such as from five volts to three and one third volts) which also proportionally decreases the amount of current consumed. Heat generation is approximately proportional to the square of the power supply voltage at which the logic circuit is operating. Therefore, a decrease in a circuit's DC supply voltage from five volts to three volts will approximately decrease power consumption by forty percent.

The amount of heat generated is of concern to chip designers, manufactures and end-product designers because cumbersome heat sinks and customized heat-dissipating circuit packaging may become necessary to prevent a small fast chip's temperature from rising above its rated operational temperature limit. Further, the heat released is generally wasted energy, and many devices containing integrated circuits typically operate on limited stored power. One familiar example is a portable computer operating on battery power. As the heat generation in a device increases, battery life decreases. Heat itself may also adversely affect the operational life and reliability of the electronic device.

Therefore, reducing the heat dissipated by a given integrated circuit is important in the design of integrated circuits and the devices into which they are incorporated.

As explained above, one way to decrease the power consumption of a circuit is to reduce the voltage at which the circuit operates. However, decreasing the operational voltage level of one circuit in a system can create compatibility problems where some other integrated circuit or other device is designed to operate at predetermined incompatible specific voltage level, or is accessible only via a bus that operates optimally at a different (e.g., higher) voltage logic level. For example, some circuits within a chip may operate at low voltage core-logic level to reduce power consumption and to interface with other chips operating at the same low voltage, while other circuits in the same chip may operate at higher voltage levels to interface with a higher logic voltage chip or bus or to operate an electro-mechanical device. Also, there are many existing integrated circuits that cannot have their operating voltage altered, yet, newer lower voltage circuits must interface with them. For example, if core logic "one" voltage were reduced from a nominal 5 volts to 3.3 V, the logic "one" value represented by 3.3 V would ordinarily be insufficient to properly drive another transistor circuit operating from a 5 V power supply. The 3.3 V logic "one" input to a 5 volt CMOS circuit would cause a prolonged transitional (i.e., conducting) state potentially resulting in damaging shoot-through currents in the CMOS circuits tied to a 5 volt supply. The rise, fall, and propagation times of signals would be detrimentally affected by the difference between core logic voltage and the circuits operating at a higher logic voltage. Therefore, to lower the voltage of integrated circuits and to consume less power, while still enabling their interaction with existing hardware components operating at a different voltage, some form of voltage level-shifting interface circuit (e.g., level-shifting buffer circuit) is required.

In general, the related art has provided a variety of voltage level-shifting interface circuits for translating lower core-logic signal levels into higher voltage signal levels and vice versa. This is because the trend in the industry has been to repeatedly decrease the core-logic voltage levels implemented in integrated circuits, while bus or pin interface logic voltages on the periphery of the same chip remain at higher levels.

Consequently, many complementary metal oxide semiconductor (CMOS) integrated circuits require more than one power supply per chip. Such designs are known in the art as "split rail designs." For instance, a split rail design is utilized when the internal or core-logic voltage, VDDIN, operates at a different (e.g., lower) voltage level than the input/output (I/O) interface voltage or output driver voltage, VDDOUT. The integrated circuit core voltage, VDDIN, applied to a given circuit may be fixed or variable depending on the integrated circuit technology, design factors, and by the performance requirements and the power supply and heat dissipation characteristics of the chip.

A conventional split-rail IC design creates many design challenges that must be addressed by integrated circuit designers. For a typical split rail integrated circuit to operate properly, it must be designed to operate within all specified ranges of frequency, core voltages and higher external voltages. For CMOS Input/Output (I/O) Integrated Circuits (ICs) to operate with a core voltage, (e.g., VDDIN as in the FIGS. 1–6), that is different or lower than the output or interface voltage, (e.g., VDDOUT as in the FIGS. 1–6), signal voltage level shifting between core logic functions and the output driver control circuitry (also referred to as "pre-drive" circuitry), is required. The level shifting circuit must level-shift the voltage (e.g., VDDIN) of the core signals that control, (i.e., "turn on" and "turn off"), the output driver circuit that is typically referenced to the higher voltage (e.g., VDDOUT).

In the related art of FIG. 1, level shifters in the DATIN (i.e., DATa INto the level-shifting output buffer) path and the OENBAR (i.e., Output-ENable not) path perform that function of level shifting the core logic signal voltage levels for the predrive NAND and NOR gates. In turn, the predrive NAND-gate and NOR-gate (not to be confused with the gates of individual transistors comprising the NAND-gate and NOR-gate) control the transistors (150 and 151) of the output driver stage. Please note that in the all the figures (i.e., FIGS. 1 through 6) wires (a/k/a lines and conductors) drawn crossing over do not connect unless the cross-over is highlighted by a darkened circle such as that at node/line 110. Conversely, wires that join at a "T" are understood to represent a connection and may also be highlighted by a darkened circle. In FIGS. 1–6, PFET transistors are drawn as PFET transistor 150 is drawn and the "back-gate" of each PFET is presumed to be tied to the supply voltage (VDD) unless indicated otherwise. In FIGS. 1–6, NFET transistors are drawn as NFET transistor 151 is drawn and the "back-gate" of each NFET is presumed to be tied to ground unless indicated otherwise. In discussing the figure of the related art and subsequent figures depicting embodiments of the invention, it should be recognized by persons skilled in the art that similarly arranged circuit components are presumed to perform the same or similar functions in each figure, allowing for design variations in physical size of individual transistors and variations in signal characteristics. Such variations are highly dependent upon the IC designer's application requirements and are not easily depicted in the diagrams. Where elements in the figures are referred to by the letter "x" appended to two numerical digits, (e.g., x50) it is to be presumed that elements in each of the figures (e.g., Figure "x"=1, 2, 3, 4, 5, 6) that have the same last two digits are of similar kind and perform the same or similar function in their respective circuit. For example, transistor x50 is a PFET transistor in each of FIGS. 1, 2, 3, 4, 5, 6, meaning that PFET transistors 150, 250, 350, 450, 550, 650 are PFET transistors performing the same or similar functions in their respective circuit, and may all be referred to by "x50."

The tristate output buffer of the related art, shown in FIG. 1, generally includes three stages: a level-shifting stage 106 comprised of one level-shifter for each core logic signal (e.g., DATIN and OENBAR), each comprised of a signal-complementing inverter (e.g., 170 and 171 for DATIN; 176 and 177 for OENBAR) and a cross-wired transistor circuit (e.g., 166, 167, 168, 169 for DATIN; 172, 173, 174, 175 for OENBAR); an output driving stage 109 (e.g., comprised of P-type pull-up transistor 150 and an N-type pull-down transistor 151); and a single predrive stage 108 including core signal-combining circuitry (e.g., a NAND-gate pre-driver comprised of transistors 152, 153, 154, 155, and a NOR-gate pre-driver comprised of transistors 156, 157, 158, and 159) to tristate the output driving stage 109 when the output buffer is not enabled by the core logic signal OENBAR. It would be apparent to persons skilled in the art that in the case where the core logic circuit is designed to provide a pair of synchronized complementing signals (e.g. OENBAR plus OEN) to the output buffer, the complementing inverter of the level-shifter in that path (e.g., 176 and 177) could be eliminated from the level-shifting stage of the output buffer. Signal OENBAR on node/line/conductor 103 is the signal from the core logic that tristates the output driving transistors x50 and x51.

In the case that the output buffer is tristated, OENBAR is logical "one." OENBAR is inverted by a level-shifter's signal-complementing inverter (comprised of transistors x76 and x77) to generate OEN-equivalent (i.e., OENBAR-complement) signal at line/conductor x04. The level shifter in the OENBAR path asserts a level-shifted OENBAR equivalent signal at node/line/conductor x23, and asserts a level-shifted OEN-equivalent (i.e., OENBAR-complement) signal at node/line/conductor x22. When signal OENBAR is a logical "one," then signal OEN (i.e., Output-ENable) is a logical "zero." The level-shifted OENBAR signal is input to the NOR-gate pre-driver at the gates of transistors 157 and 158. In this case OENBAR is a logical "one" and forces the NOR-gate output x11 to be a logical "zero." Thus, transistor x51 is turned "off" because the gate voltage of NFET x51 is then ground (e.g., 0 V).

Similarly, signal OEN (i.e., OENBAR-complement) on line x04 is level-shifted and driven to the NAND-gate pre-driver at transistors 154 and 152 via line/conductor 122. In this case OEN is a logical "zero" and the NAND-gate output x10 is forced to a level-shifted logical "one" (e.g. VDDOUT). Thus PFET transistor x50 is turned "off" because the its gate voltage is VDDOUT volts.

Therefore, for the case that OENBAR is a logical "one," output transistors x50 (e.g., 150, 250, 350, 450, 550 and 650) and x51 (e.g., 151, 251, 351, 451, 551, 651) are both "off" thereby tristating the output buffer.

In the case that the output buffer is turned "on" and not tristated, OENBAR on lines x03 and 123 is a logical "zero." OEN on lines x04 and 122 is a logical "one." The NAND-gate pre-driver is enabled and acts like an inverter of the level-shifted DATIN-equivalent signal asserted on line 131. Similarly the NOR-gate pre-driver is enabled and acts like an inverter of the level-shifted DATIN-equivalent signal asserted on line 131. If DATIN (e.g., on lines x02 and 131) is a logical "one," both the NAND-gate pre-driver output x10 and the NOR-gate pre-driver output x11 are logical "zero." This turns "on" PFET transistor x50 and keeps or turns NFET transistor x51 turned "off." The output at x01 (e.g., 101, 201, 301, 401, 501 and 601) is charged towards VDDOUT to represent a logical "one." In the case that DATIN (i.e., on lines x02 and 131) is a logical "zero," both the NAND-gate pre-driver output x10 and the NOR-gate pre-driver output x11 are logical "one." This turns "on" NFET transistor x51 and keeps or turns PFET transistor x50 turned "off." The PAD output x01 is discharged towards ground to represent a logical "zero." To conserve power, the core logic that asserts the signals OENBAR on line x03 and DATIN on line x02 may have the power supply voltage (e.g., VDDIN) reduced (e.g., below VDDOUT) either dynamically or permanently.

While the conventional three-stage configuration of the related art of FIG. 1 is often adequate to ensure that the output driver's PFET is completely shut "off" when a logical "one" is present on nodes 131, 122, and 110, the process of designing an operational physical IC with the conventional three stage configuration to perform the level shifting output buffer function is difficult.

The conventional three stage output buffer's limitations also can generate delay and/or duty cycle penalties in circuit design because of the large size of the transistors of the level-shifters (i.e., 166, 167, 168, 169 and 172, 173, 174, 175) that are required in the conventional buffer to drive the NAND-gate and NOR gate. The NAND and NOR gates typically have large transistors in order to drive the typically large, low impedance, output driver transistors (x50 and x51). Thus, the large size of transistors of the NAND and NOR gates of the conventional predrive stage present a large capacitive load to the level shifter(s) in the output offer of the related art in FIG. 1. As the size of the transistors in the level shifter (e.g., x66, x67, x68, x69) are increased during physical output buffer design to drive this load, the delay into and through the level shifter increases. Also corresponding to the larger size of the transistors in the level shifter(s), larger transistors are required in the core of the IC chip to interface with the larger transistor gates of the level-shifting stage.

Further, the design of an operable output buffer becomes more difficult in the related art of FIG. 1 because the large PFETS (e.g., 167 and 166) must overcome the large NFETS (e.g., 168 and 169), to change logic states at the level shifter output nodes/lines (e.g. 131, 132, 122, 123). Designing a physical output buffer circuit of the related art to have balanced rising and falling transitions seen by the NAND and NOR gates is difficult, which in turn makes it difficult to balance the rising and falling transitions seen by the gates of the transistors of the output driver stage (x50, x51).

All of these problems mean that physical IC design using the level shifting output buffer of the related art of FIG. 1 has unnecessary and undesirable delay penalties and duty cycle (balancing) penalties that are far from trivial to overcome. Additionally, the multiple larger transistors within the level-shifters of the related art by themselves consume more power than they would if they were smaller in size. The larger transistors of the level-shifting stage of the related art of FIG. 1 also put a larger (capacitive) load on the circuits of the core logic connected to the output buffer of the related art. Larger level-shifting transistors therefore add signal propagation delay from the core and/or require larger transistors within that core circuitry which consume more power than need be consumed. In an IC chip having a multiple (e.g., dozens) of pins or interfaces each having a conventional three-stage level shifting output buffer of the related art of FIG. 1, the finite amount of power unnecessarily wasted by each such output buffer is multiplied by the number of such buffers on the chip. There is a universal need in the field of ASIC design to reduce power consumption however possible where such can be accomplished without impairing the performance of the circuit.

SUMMARY OF THE INVENTION

The present invention describes the design and implementation of a low power CMOS bidirectional I/O buffer that translates low voltage core logic level signals into the higher voltage logic level signals, and vice versa. The present invention solves the problems of the related art output buffer by providing a first predrive stage comprised of buffers (e.g., CMOS inverters) for tuning and balancing the circuit in addition to the core signal combining circuit of the second predrive stage, thereby enabling IC designers to reduce the size of transistors in the level-shifting stage and providing more flexibility in the tuning of the predrive circuitry to synchronize or balance the logical transitions of the complementary transistors of the output driving stage. The present invention provides a faster balanced level-shifting output buffer which enables higher frequency operation.

The present invention decreases power consumption for a system that supports multiple DC voltage supplies. Accordingly, the present invention provides a reduction of power consumption within a level-shifting output buffer as well as enabling a reduction of power consumption in the core logic circuitry that drives the signals into the output buffer. The present invention bidirectionally translates low voltage logic level signals into higher voltage logic level signals, and can support level-shifting output buffers tied to multiple DC voltage supplies.

Generally, the present invention provides an output buffer circuit comprising:

an input stage receiving a data input signal;

a first predrive stage comprised of one or more buffers on one or more signal paths out of the input stage;

a second predrive stage comprising a signal combining circuit, said second predrive stage operatively driven by an output of the first predrive stage; and an output driving stage operatively driven by an output of the second predrive stage.

The present invention additionally provides an interface circuit for translating a lower voltage logic signal into a higher voltage logic signal, comprising:

a level-shifter circuit driven by said lower voltage logic signal;

one or more tuning inverters driven by an output from said level-shifter circuit;

one or more signal combining circuits driven by an output from one or more of said tuning inverters, said signal combining circuit adapted to tristate the output of the interface circuit; and an output driving circuit driven by said signal combining circuit, said output driving circuit being adapted to drive said lower voltage logic signal out of the interface circuit.

The foregoing and other features of the present invention will be apparent in the following and more particular description of several embodiments of the invention as illustrated in the accompanying drawings.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

The present invention includes a method and apparatus for a low power CMOS bidirectional (i.e., input and output or I/O) buffer typically located, for example, at bonding pads on I/O pins of integrated circuit chips. In the case of driving signals from the core of the chip out of the IC, the invention can translate internal low voltage logic signals (e.g., at voltage VDDIN) into higher logic level output signals (e.g., at voltage VDDOUT). In the case of receiving signals, the invention in combination with related art low power input buffers can translate various external logic level input signals into internal low voltage logic level signals. In the case of level-shifting and driving core logic signals out of the IC, the invention reduces power consumption, which simplifies heat dissipation requirements, improves performance, and maximizes the operating time for systems operating from limited power supplies. The invention ideally supports a system with mixed voltages.

Figure 1:
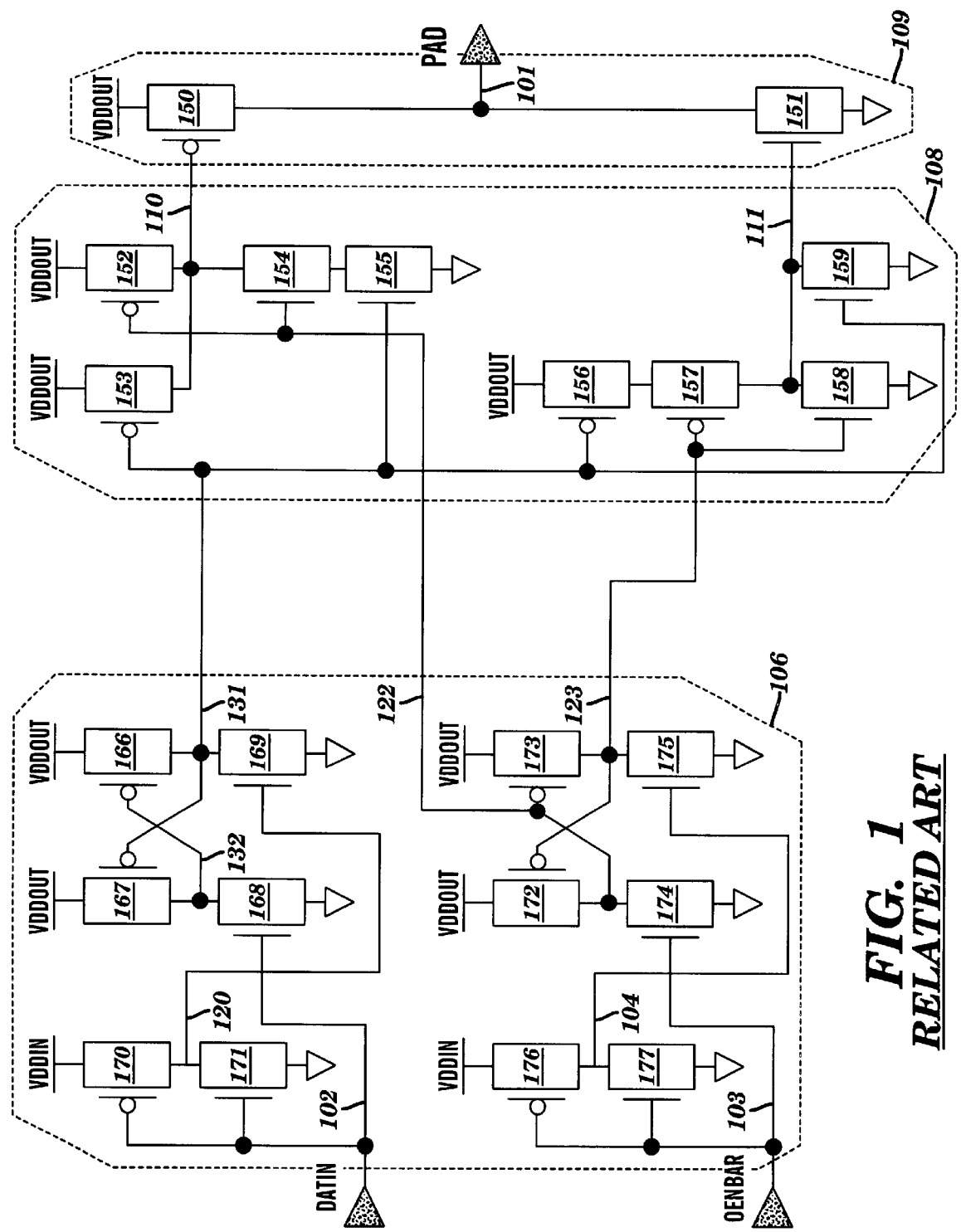
FIG. 1 depicts a schematic diagram of a conventional three-stage level-shifting CMOS output buffer circuit of the related art.

Referring to the drawings, FIG. 1 illustrates, for sake of comparison, an example of the related art problem discussed supra. The conventional output buffer circuit shown in FIG. 1 illustrates a typical level-shifting CMOS output buffer circuit including three stages: a level-shifting stage 106; a single predrive stage 108 including core signal combining circuits (e.g., NAND-gate, NOR-gate); and an output driving stage 109.

The invention, as embodied in the improved CMOS level-shifting CMOS output buffers depicted in FIGS. 2, 3, 4, 5, and 6, comprises an additional "tuning" stage referred to as a "first predrive stage" x07 (e.g., 207, 307, 407, 507, 607) comprised of one or more CMOS inverters (e.g., 290 and 291, 292 and 293; 394 and 395, 396 and 397; 496 and 497) within the predrive circuitry e.g., 207 and 208.

The invention, as embodied in the schematics of FIGS. 2, 3, 4, 5 and 6 overcomes the disadvantages of the level shifting output buffer of the related art shown in FIG. 1, by adding discrete buffers, e.g., CMOS inverters, between the level shifter(s) and the NAND and NOR predrive stage, as shown in FIGS. 2, 3, 4, 5 and 6. The advantages arising from the addition of circuit elements (e.g., 290, 291, 292, 293) is actually counterintuitive since it would be assumed that the additional buffers in the signal path would add additional propagation delay to the output buffer circuit. However, because the transistors of the inverter/buffers (x90, x91, x92, x93; x94, x95, x96, x97) can be sized more easily (than the transistors of the level shifters) to control the typically large transistors in the NAND and NOR circuits (x52, x53, x54, x55; x56, x57, x58, x59), and will be smaller in size than the NAND and NOR circuits, they impose a smaller load on the level shifter. The sizes of the level shifters, transistors (e.g., x66, x67, x68, x69, x70, x71 in FIGS. 2–6); and e.g., x72, x73, x74, x75, x76, x77 in FIGS. 3 and 4) are therefore significantly reduced in design. The smaller the transistors in the level shifter are, the faster the level shifter can change states at its output nodes/lines (e.g., x31, x32; x22, x23). Therefore, the small delay penalty attributed to the addition of the buffers of the tuning predrive stage x07 is more than recouped from the smaller delay through (and into) the level shifter.

In addition, placing individual buffers (e.g. 290 and 291, 292 and 293) between the level shifter (in x06) and the NAND and NOR gates (in x08) simplifies the integrated circuit designer's task of tuning (i.e., balancing) the rising and falling transitions seen by the NAND and NOR gates (in x08) as well as seen by the output driver (in x09). The output driver's pull-up PFET (x50) is typically about twice the size (i.e., width) of the output driver's pull-down NFET (x51) in order to achieve the same pull-up impedance as pull-down impedance. This ratio-ing causes the NAND and NOR circuit devices (e.g., in 208, 308, 408, 508) to be sized differently and makes it advantageous to have individual buffers interfacing between the level shifter and the NAND and NOR circuits to aid in tuning (i.e., balancing) the turn-on and turn-off timing of the output PFET and NFET. A failure to properly tune the timing (i.e., synchronize) the turn-on and turn-off of each of the PFET and NFET pull-up and pull-down transistors of the output drive can result in dangerous "shoot-through current" during moments in transition when they (x50 and x51) are both "on." Avoidance of the undesirable shoot-through current is made easier by the inventive addition of tunable buffers (in x07) interfacing between the level shifter and the NAND and NOR circuits.

Because the sizes of transistors of the NAND-gate and of the transistors of the NOR-gate are typically much different, (in order to properly control the different sized PFETS and the NFETS of the output stage x09), individual buffers (i.e., x90 and x91; x92 and 93) between the level shifter (in x06) and the NAND and NOR circuits (e.g., 208) simplifies the task of tuning or balancing the rising and falling transitions seen by the NAND and NOR circuits as well as by the output driver.

Figure 2:
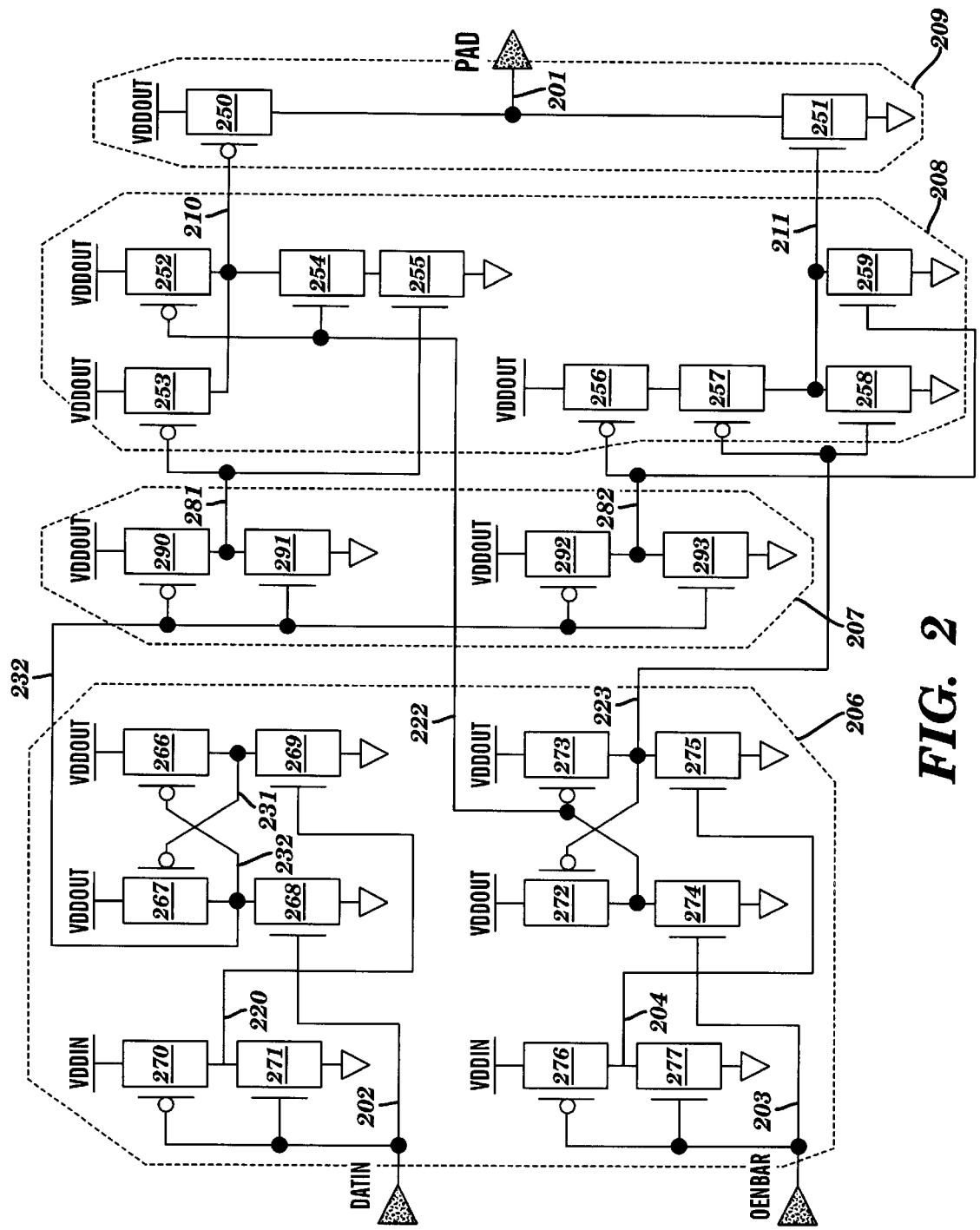
FIG. 2 depicts a schematic diagram of an improved level-shifting CMOS output buffer circuit in accordance the present invention wherein there is a first predrive stage comprised of dual tuning inverters connected between the level-shifter of the DATIN signal path, and the NAND/NOR combining circuit of the second predrive stage.

FIG. 2 shows the addition of the buffers (comprised of transistors 291, 292, 293, 294) in the core data (e.g., "DATIN") path which improves the performance of that path.

Figure 3:
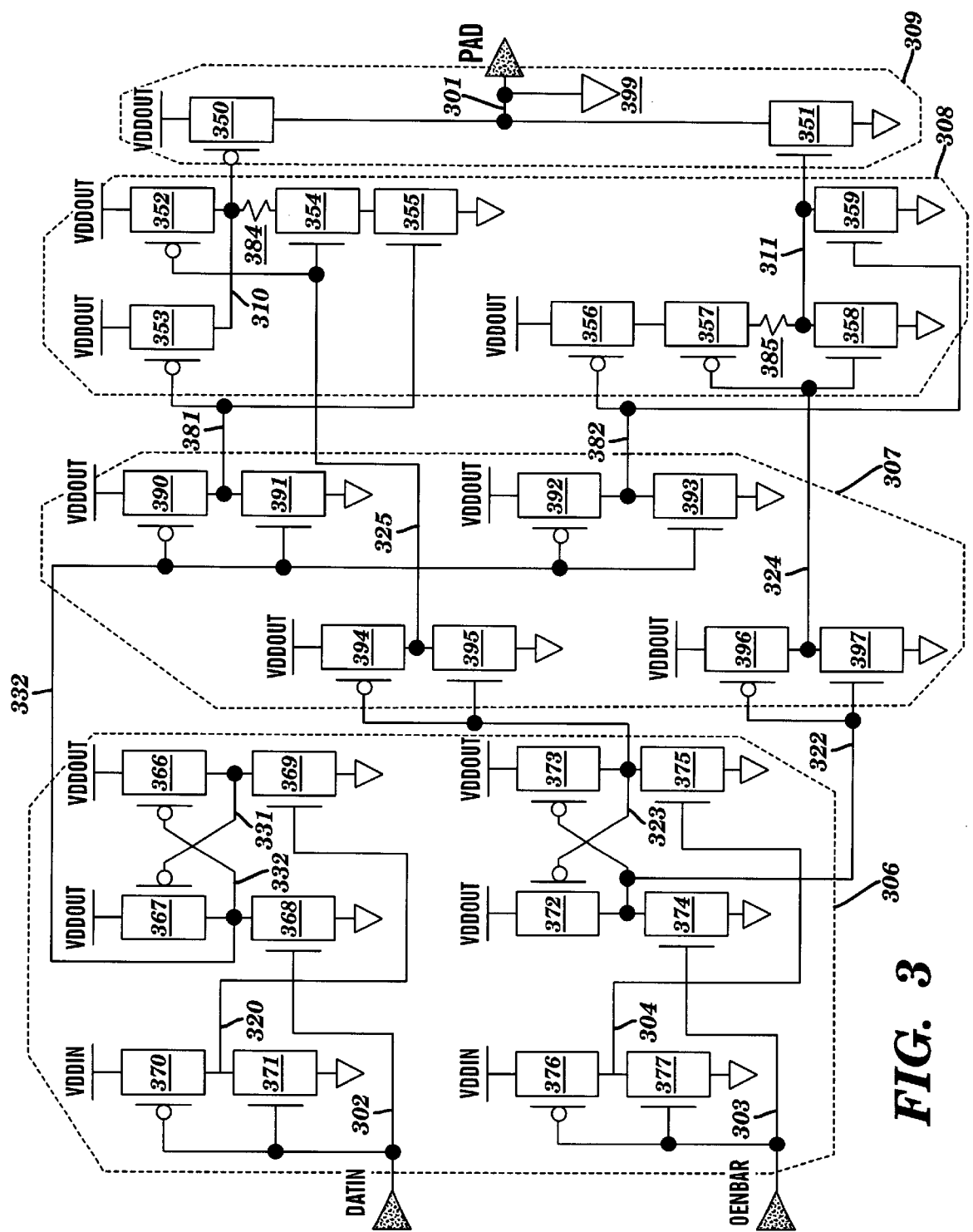
FIG. 3 depicts a schematic diagram of an improved level-shifting CMOS input/output buffer circuit in accordance with the present invention wherein dual tuning inverters are connected between the level-shifters in the paths of both of the signals DATIN and OENBAR, and the combining circuit of the second predrive stage.

The same improvements can be accomplished for the output-enable-not (e.g., "OENBAR") path by inserting buffers (e.g., 394, 395, 396, 397) in that path as well as shown in FIG. 3.

Figure 4:
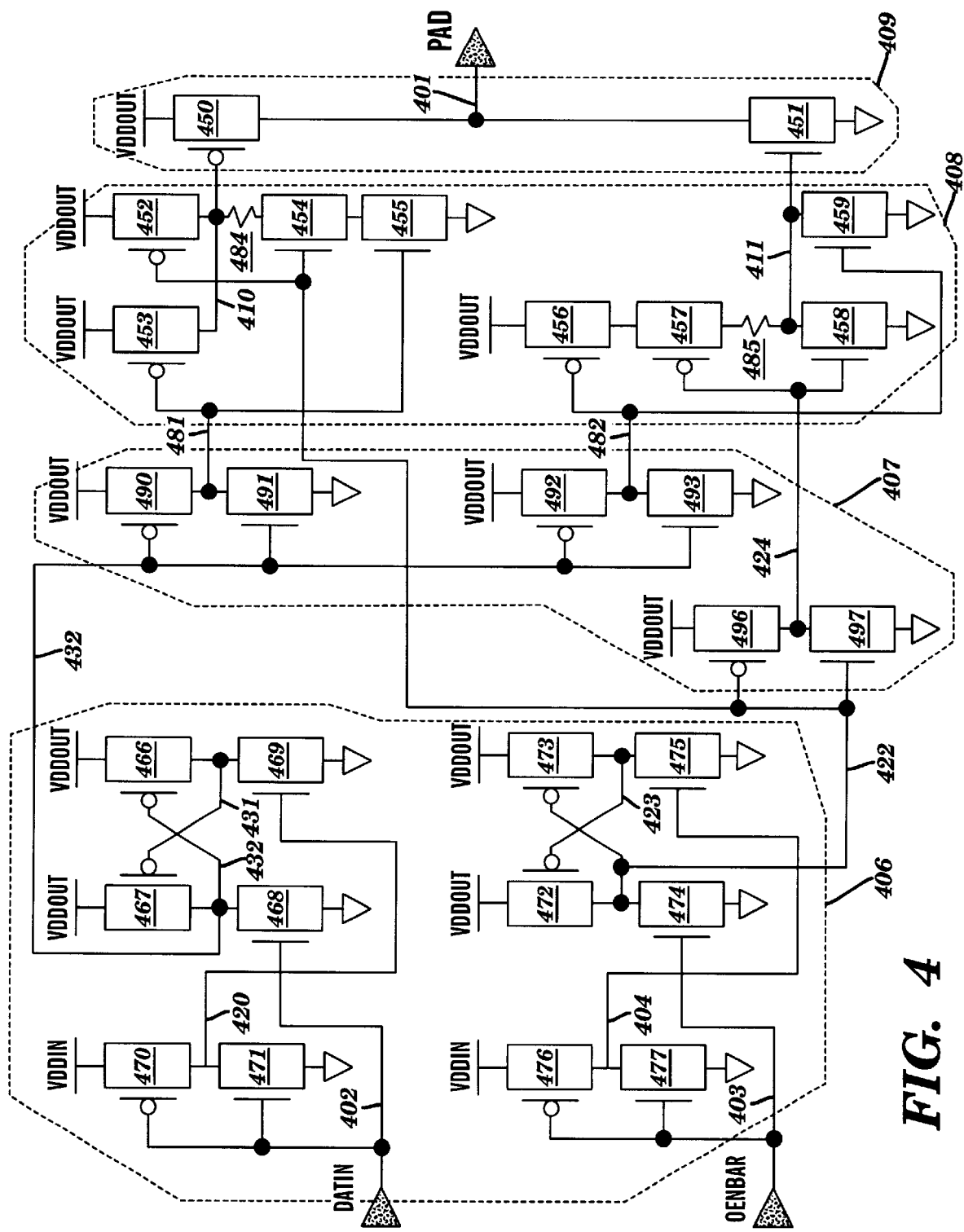
FIG. 4 depicts a schematic diagram of an improved level-shifting CMOS output buffer circuit in accordance with the present invention wherein at least one tuning inverter is connected between each of the level-shifters of the level-shifting stage, and the combining circuit of the second predrive stage.

FIG. 4 shows that the two buffers (depicted in FIG. 3) in each signal (e.g., OENBAR and/or DATIN) paths through the first predrive stage (x07) can be reduced to one buffer (e.g., 496 and 497) in either or both paths.

Figure 5:
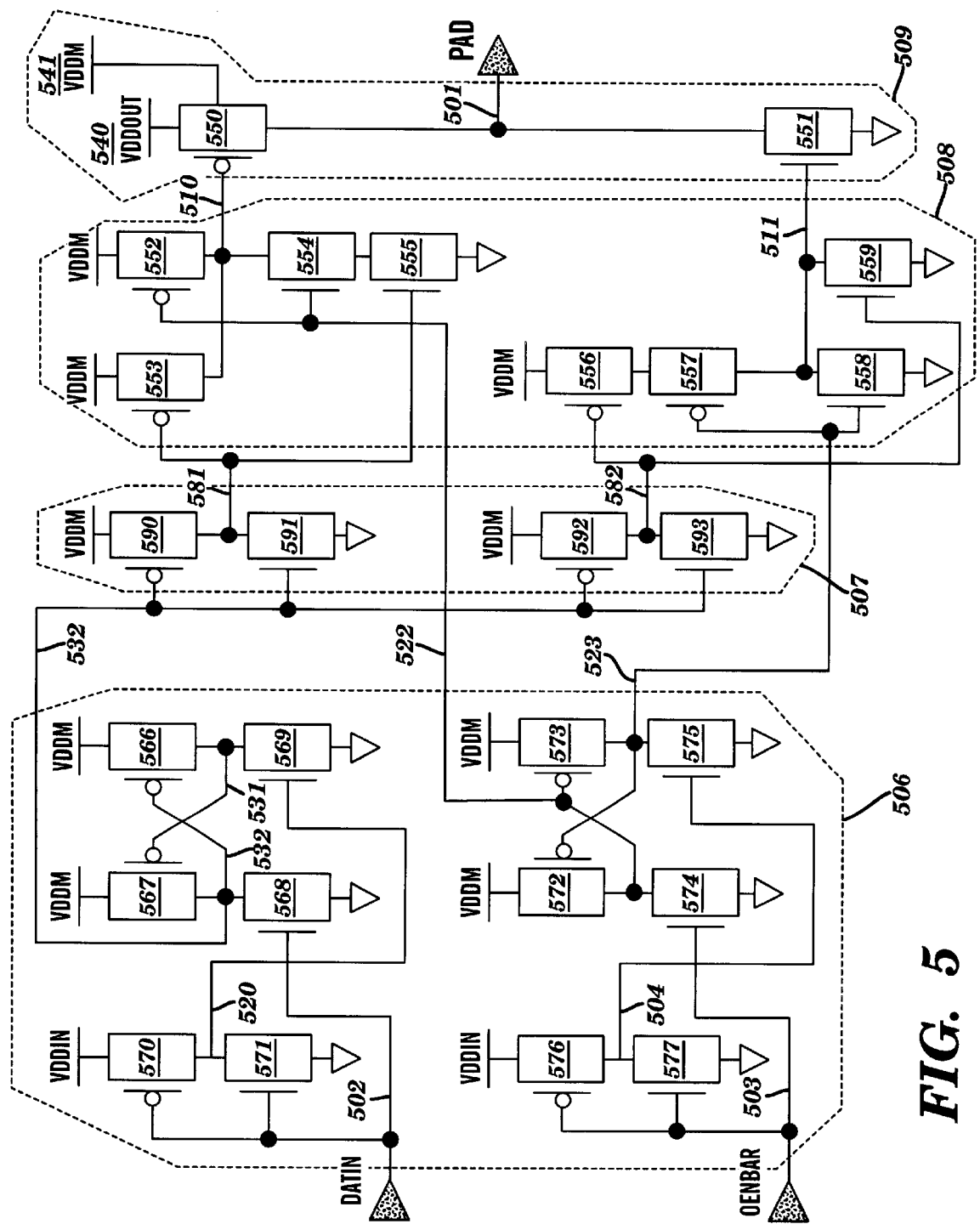
FIG. 5 depicts a schematic diagram of an improved level-shifting CMOS output buffer circuit in accordance with the present invention wherein there are three voltages provided to the transistors of the output buffer circuit.

FIG. 5 shows that in a circuit embodying the invention, the output driver's (509) pull-up voltage, VDDOUT (540) at the source of PFET 550, can differ from the reference voltage VDDM (541), of the level-shifting and predrive circuitry (506, 507, 508) and at the back-gate of 550, provided that VDDOUT is a voltage less than or equal to VDDM.

Figure 6:
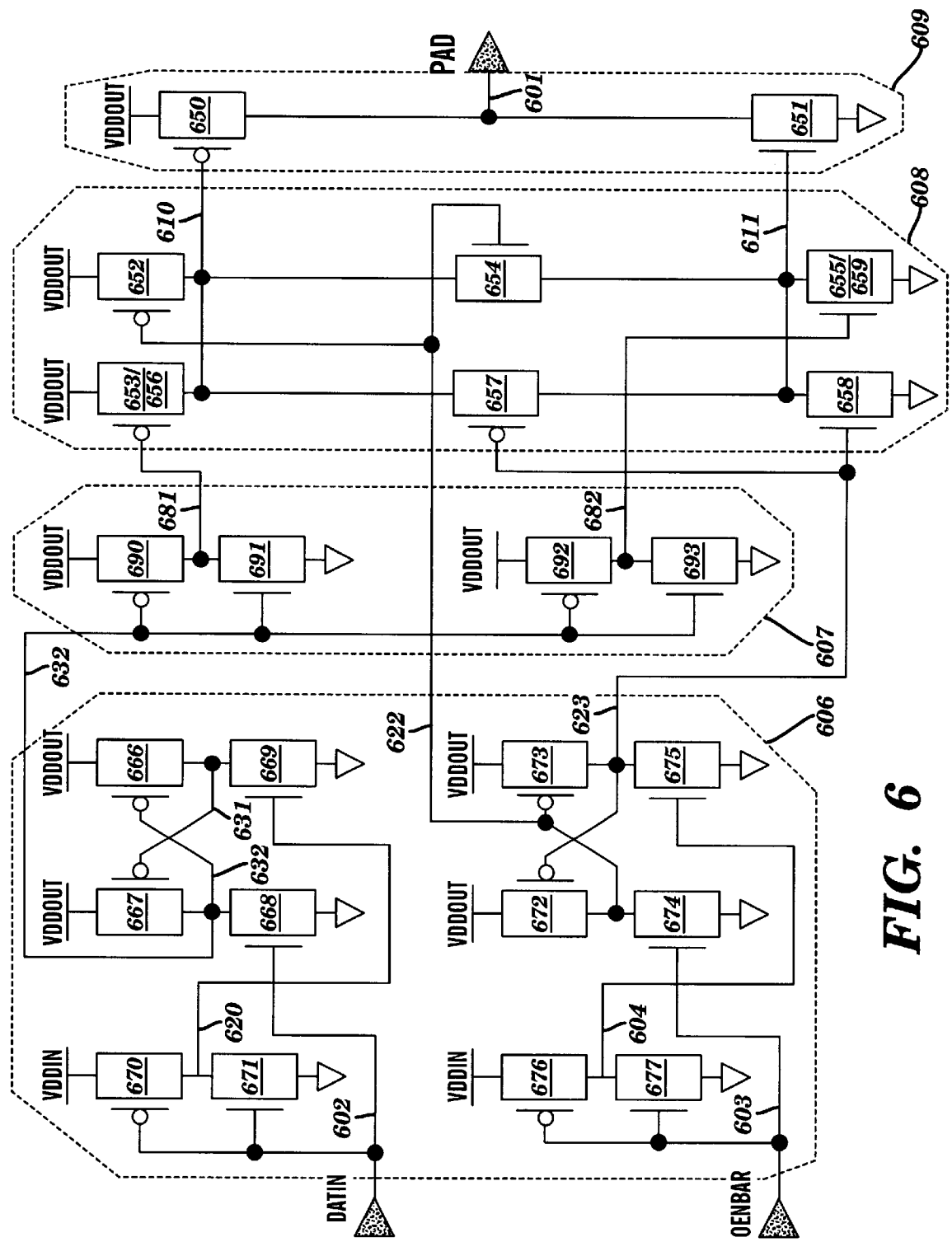
FIG. 6 depicts a schematic diagram of an improved level-shifting CMOS output buffer circuit in accordance with the present invention wherein the core signal combining circuit of the second predrive stage comprises a merged NAND-NOR gate circuit that is implemented with six interconnected transistors.

FIG. 6 shows an alternative to the discrete NAND/NOR design of the pre-drive, which will also benefit by the insertion of the tuning buffers after the level shifters for the same reasons described previously. In this embodiment, certain of the distinct transistors of the NAND-gate and NOR-gate (i.e., of the second predrive stage 608) having the same gate voltage (e.g. ground) and the same gate signal (e.g. OENBAR) have been combined, as compared with the circuit of FIG. 2. Specifically, DATIN-VDDOUT transistors x53 and x56 (e.g., 253 and 256) have been combined into one transistor 653/656 on silicon; and OENBAR-ground transistors x55 and x59 (e.g., 255 and 259). Attendant adjustments to wiring and transistor sizes, as compared with the wiring and transistors of FIG. 2, would be performed by IC designers in accordance with the objectives of the invention.

The invention can be manufactured in different CMOS (Complimentary Metal Oxide Semiconductor) processes. FIG. 2 illustrates of a schematic of the invention manufactured in a CMOS process that either contains an n-well or both an n-well and a p-well (also known as twin-tub). P-type transistors (also referred to as PFET or PMOS transistor) are represented by the transistor symbol of transistor 270 in FIG. 2. N-type transistors (also referred to as NFET or NMOS transistors) are represented by the transistor symbol of transistor 271 in FIG. 2. The reference to P-type or N-type transistor is not generally used in the text but can be discerned from the figures.

The N-type transistors are assumed to have their respective P substrate or P-well (twin tub) tied to ground (e.g., 0 V) as indicated by the lack of any contrary indication on the transistor symbol. The symbol for ground is the unfilled triangle symbol such as is depicted at the source of the N-type transistor 271 of FIG. 2. Assume that each N-type transistor that has a connection to this ground symbol has its back-gate tied to ground. The power source for ground is sometimes referred to as the negative power supply or VSS and in digital CMOS circuitry it is usually represented by 0 V.

The bidirectional or I/O buffer includes two main components. The first component is an input buffer extending from the PAD line x01 (e.g., 201, 301, 401, 501,or 601) as depicted for example by line 399 drawn explicitly in FIG. 3. The PAD is represented by a black-filled triangle as in FIG. 2. The PAD is a bonding surface that allows for a wire from an integrated circuit package to connect a pin of the integrated circuit package to the electronics within a semiconductor substrate. Persons skilled in the art would know where and how to construct and operate a suitable input buffer (e.g., at end of line 399). The second component is a level-shifting output buffer comprised of transistors x50 through x59 and x66 through x77 and additionally comprising tuning buffer transistors (e.g., 290 through 293). All of these elements are operatively connected together at a PAD at node/line x01 (e.g., 201 in FIG. 2). Signals received at the PAD by the invention are input into the input buffer (e.g. extending from line 399). Signals output at the PAD from the core logic are output through the four stages (x06, x07, x08, x09) of the output buffer of the invention.

Input Buffer

The input buffer executes the voltage translation for a logical "one" input from a higher external voltage level (VDDOUT) circuit at PAD, to VDDIN volts (core logic voltage) at the input buffer's connection with the core circuitry. Various designs for input buffers suitable for operation with the disclosed output buffer are known to persons skilled in the art.

Persons skilled in the art would know that such an input buffer would connect with the disclosed output buffer at a conductor at the PAD (at 201). The location of a manner of connection suitable for an embodiment of the present invention is illustrated by line 399 in FIG. 3. The circuits of input buffers are generally simpler than that of output buffers because usually no voltage translation is necessary, since a higher logic voltage level driving a circuit operating from a lower supply voltage will generate the logically correct signal in the lower voltage device tied to the same ground voltage. One design for a suitable input buffer might include a CMOS inverter tied to VDDIN. However, even pins that are properly receiving signals consume power if not disabled. If input signals are not needed by the core logic then an ungated inverter driven from rail to rail, (for example by outgoing signals from the core, or other signals on the bus), is consuming AC switching power needlessly. Thus when not reading signals into the core logic, the first stage of the input buffer can be set (referred to as disabled) to ignore all signals at the PAD, including signals that are floating, such that power consumption can be reduced. Therefore, it may be desirable to turn "off" the input buffer when not reading signals from the PAD. This would reduce power consumption by causing the switching transistors of the input buffer to ignore the changing signals at the pad.

Tristate Output Buffer

In general, the output buffer translates low voltage (e.g., VDDIN) level logic signals from the core into the desired higher voltage (e.g., VDDOUT) logic level signals and increases the drive strength at the PAD x01. In the embodiments of FIGS. 2, 3, 4 and 6, the desired output logic voltage level VDDOUT, is provided by tying the sources and back-gates of pull-up transistors (e.g., x50, x52, x53, x66, x67, x90, x92, in FIGS. 2, 3, 4 and 6) within the output buffer circuit, other than core signal input-complementing transistors of the level-shifters (e.g., x70 and x76), to higher voltage VDDOUT, which is the logic voltage level of the external circuits. In an alternative embodiment of the invention depicted in FIG. 5, where three different voltages may be supplied to the output buffer circuit, the desired output voltage level is selected by tying the source of the output driving pull-up PFET (550) to the appropriate logical voltage, e.g., VDDOUT (540) while the "back gate" of PFET 550 and the sources and back-gates of other pull up transistors at the interior of the output buffer (e.g., 566, 567, 590, 552, 553, 572, 573, 592, 556) are tied to a higher voltage VDDM (541).

Translation first starts by converting the core logic level signals (e.g., DATIN) into the highest power supply level of the output buffer circuit (e.g., VDDOUT in FIG. 2; VDDM in FIG. 5).

To enable the desired output logic level, the final PFET transistor x50 has VDDOUT tied to its source. In the embodiment of FIGS. 2, 3, 4 and 6, the N well of transistor x50 and of each other PFET whose source is tied to VDDOUT, are presumed to be tied to VDDOUT. The circuits in the first predrive stage x07 (comprised of transistors x90–x93) and second predrive stage x08 (comprised of transistors 252–259) are also powered by VDDOUT (or by a voltage level that is no less than VDDOUT). If this were not the case, the voltage present at transistor gates at x10 and at x11 of transistors x50 and x51 (e.g., 250 and 251) would not provide the proper drive levels to meet nominal output specifications for rise, fall, or propagation delay, nor would the output transistors x50 be completely shut off when a logic "1" is present on its gate.

Signal DATIN from the core logic at node/line x02 is the data that is desired to be transferred from the core logic out to the PAD. OENBAR signal at node/line x03 represents the Output ENable-not signal that tristates the output at node x01 when OENBAR is high. In the case that OENBAR is high, the second predrive stage x08 (e.g., comprised of transistors 252–259 in FIG. 2) of the output buffer is effectively disabled, output transistors x50 and x51 (e.g., 250 and 251) are off and do not source or sink current into or out of the PAD.

Voltage Translation

Voltage levels of the core logic signals DATIN and OENBAR need to be translated into higher voltage levels that may be used to drive the final stage (the output driving stage x09) of the tristate output buffer. Logical "zero" (also referred to as a low logic level) is represented by 0 V and does not require translation. However, logical "one" (also referred to as a high logic level) of signals DATIN and OENBAR is represented by a voltage of VDDIN which must be translated into a voltage level of VDDOUT. This is accomplished by the use of voltage level shifters in the level-shifting stage x06 (e.g., comprised of transistors 266–277 in FIG. 2). In FIG. 2, for example, the inverter comprising transistors 270 and 271 in conjunction with the cross wired transistors of 266, 267, 268, and 269 represents the voltage translator for the signal DATIN. The inverter comprising transistors 276 and 277 in conjunction with the cross wired transistors of 272, 273, 274, and 275 represents the voltage translator for the signal OENBAR.

The N-type transistor threshold in a typical semiconductor fabrication process varies from 0.6 to 1.2 V. The N-type transistors 268, 269, 274, and 275 will turn on for a voltage applied to their respective gates that is greater than the N-type transistor threshold voltage. Persons skilled in the art realize that this places an operational limit on the core voltage VDDIN such that it must be greater than the transistor threshold voltage of the specified semiconductor process. Typical maximum N-type transistor threshold voltage is 1.2 V. Thus the voltage level shifters will operate correctly with any VDDIN DC supply voltage that is greater than 1.2 V. This allows chips to be designed with voltage level shifters that operate with a VDDIN DC supply voltage from below 2.0 V up to VDDOUT volts, which is typically 5 V.

N-type transistors of the level shifters (e.g., 268, 269, 274, and 275) and corresponding P-type transistors (e.g., 267, 266, 272, and 273) are respectively ratioed such that for a worst case value of VDDIN equal to 3.0 V and a worst case value of VDDOUT equal to 5.5 V the N-type transistor (such as transistor 268) can overcome the current supplied by the P-type transistor (such as transistor 267) to flip the voltage translator to the opposite state. This assures that the design of the voltage translator can translate 3.3 V CMOS core logic level into 5 V CMOS output logic levels or 3.3 V CMOS core logic levels into 3.3 V CMOS output logic levels or 5 V CMOS core logic levels into 5 V CMOS output logic levels. Other voltage translations, e.g., from core=1.8 V to output=2.5 or 3.3 V, or core=2.5 V to output=3.3 V, etc., may also be provided. Thus, VDDIN can be set to a 3.3 V DC supply voltage and VDDOUT can be set to a 5 V DC supply voltage, or VDDIN can be set to a 3.3 DC supply voltage and VDDOUT can be set to a 3.3 V DC supply voltage, or VDDIN can be set to a 5 V DC supply voltage and VDDOUT can be set to a 5 V DC supply voltage, and in each case the voltage translator properly translates the respective logic levels. The inventive addition of the tuning inverters of the first predrive stage x07 such as are comprised of transistors 290–293 in embodiment depicted in FIG. 2, allow for a reduction of size of all the transistors of the level shifting stage x06, which makes it easier for the IC designer to ratio and reduce the opposing N-type and P-type transistors of the level shifting stage.

An additional advantage of this invention is that the physical sizes (e.g., channel widths) of the transistors in the level shifting stage x06 (e.g., 266–277 in FIG. 2) can be designed to be smaller than in conventional output buffers, because less current is needed from the level shifters x06 to drive the first predrive stage x07 than would be needed to drive the large NAND-gate NOR-gate circuit of second predrive stage x08 that would be driven directly by the level shifters in the configuration of the conventional output buffer, such as depicted in FIG. 1. By allowing for a chip designer to reduce of the size of the transistors of the DATIN level shifter (e.g., 266–271), and/or of the OENBAR level-shifter (e.g., 372–377), the present invention provides a way to reduce the load (capacitance) as seen from the core logic side of the output buffer interface, thereby reducing delay and or power consumption within those circuits. The beneficial features of the invention also improve the time of the level-shifted signal propagating through the level-shifting stage of the invention (e.g., 206, 306, 406, 506, 606) as compared with data signal propagation times through a conventional level shifter (e.g., 106).

The cross-wired transistors of the level-shifters (e.g., 272 and 273; 274 and 275) logically operate similar to a pair of cross-coupled inverters in a RAM cell or latch. The signal DATIN is inverted by transistors x70 and x71 to generate DATIN-complement signal at line x20. The signals DATIN and DATIN-complement driving opposites sides of the cross wired transistors tip the balance of the logical state of the cross wired transistors. For example, assume initially that DATIN is a logical "zero" such that DATIN signal is 0 V. Therefore DATIN-complement initially is a logical "one" such that the DATIN-complement signal is VDDIN volts on line 220. P-type transistors 267 and 266 are tied to the VDDOUT voltage supply at their source connection so that nodes/lines 231 and 232 vary in a range from 0 V to VDDOUT volts. Thus the initial states of DATIN (at logic "zero") and DATIN-complement set the cross coupled transistors such that node/line 232 is VDDOUT volts (i.e., logic "one") and node/line 231 is 0 V. For DATIN to logically change state from a "zero" to a "one," signal DATIN transitions from 0 V to VDDIN volts while DATIN-complement transitions from VDDIN volts to 0 V. As DATIN transitions from 0 V to VDDIN it begins to turn on transistor 268 such that node 232 begins to transition from VDDOUT volts to 0 V. Since DATIN-complement is transitioning from VDDIN to 0 V this turns off transistor 269 and allows node 231 to transition from 0 V to VDDOUT volts. (In FIG. 5, nodes/lines 531 and 532 alternately transition from 0 V to VDDM volts.)

For DATIN to logically change state from a "one" to a "zero," signal DATIN transitions from VDDIN volts to 0 V while DATIN-complement transitions from 0 V to VDDIN volts. As DATIN transitions from VDDIN volts to 0 V it begins to turn off transistor 268 such that node/line 232 is allowed to transition from 0 V to VDDOUT volts. Since DATIN-complement is transitioning from 0 to VDDIN volts, this turns on transistor 269 and causes node/line 231 to transition from VDDOUT volts to 0 V. In this manner, logical "zero" represented by 0 V and logical "one" represented by VDDIN volts within the core logic are respectively translated into 0 V and VDDOUT volts. Note that node/line 232 represents the logical equivalent of DATIN-complement and that because of the improved features of this invention, node/line 231 is not used to directly drive any output.

Tuning (First Predrive) Stage

The logical equivalent voltage of signal DATIN-complement is asserted at node/line x32 and is directly connected to the gates of each transistor in the first predrive stage x07 of the invention comprised of two tuning inverters x90 through x93 (e.g., 290–293 in FIG. 2). Each of the tuning inverters of the first predrive stage x07 directly drives the circuits of the second predrive stage x08 comprised of the tristating NAND-gate (x52–255) and NOR-gate (x56–259) which drive the logic state (i.e., DATIN) out to the PAD through the output driving stage x09.

The voltage level shifter for OENBAR signal at x03 is nearly identical and operates in the same way. One difference is that both outputs of this voltage level shifter are used (e.g., to enable or disable the tristate output buffer employing the NAND/NOR gate logic). Note that node 222 logically represents OEN and node/line 223 logically represents OENBAR. As depicted in FIG. 2, it is not necessary, in order to obtain the benefits of the invention herein, to provide a first pre-drive stage (e.g., comprised of one or more inverters) between the level shifter for OENBAR signal and the NAND-gate (252–255) and NOR-gate (256–259). This is because the output-enable-not signal will ordinarily not switch as frequently as the data signal from the core. However, as is disclosed in the alternate embodiments of the invention depicted in FIG. 3 and FIG. 4, the inventive technique of this invention may be further applied to provide a first predrive stage (comprised of one or more tuning inverters) for the OENBAR signal as well.

Signal Combining (Second Predrive) Stage

The outputs of the invention's first predrive (tuning) stage x07 (comprised of transistors 290–293 in FIG. 2) are input to a NAND-gate, (comprised of transistors 252, 253, 254, and 255 in FIG. 2), and to a NOR-gate (comprised of transistors 256, 257, 258, and 259 in FIG. 2). The NAND-gate controls the output driving P-type pull-up transistor x50 (e.g., 250); and the NOR-gate controls the output driving N-type pull-down transistor x51 (e.g., 251). These two logic gates (NAND and NOR) comprise the second and final predrive stage x08 for the output driving transistors and facilitate the tristate mechanism as well as providing the correct polarity of DATIN to the PAD. The NAND-gate is also referred to as the NAND pre-driver. The NOR-gate is also referred to as the NOR pre-driver. An alternative embodiment of the invention replaces the separated NAND and NOR-gate pre-drivers with a logical equivalent comprised of six transistors as illustrated by FIG. 6.

Recall that in FIG. 5, VDDM (541) is the highest voltage power supply within the system. The output driving P-type power transistor 550 is configured in this embodiment of the invention so that its N well (back-gate) is tied to VDDM. The source, VDDOUT, of output driving PFET transistor 550 may be less than or equivalent to VDDM. The power supplied to the first and second predrive stages, 507 and 508, is VDDM. Thus this level of voltage can be asserted to the gate of the output driving transistors 550 and 551 via lines 510 and 511 respectively. Since VDDM is greater or equal in voltage to VDDOUT the NAND pre-driver will correctly drive the P-type pull-up transistor into the appropriate switching region. This is the case regardless whether VDDOUT is set to 3.3 V or 5 V so long as VDDOUT is less than or equal to VDDM. The cross-wired transistors of the level shifters in this embodiment are also tied to VDDM to generate voltage signals appropriate for predrive circuitry tied to VDDM. The invention is practiced in this three-voltage embodiment in the same manner, with the same advantages since transistor sizes in the level shifting stage 506 may likewise be reduced through the inclusion of the CMOS inverters of the first predrive stage 506.

Thus, in all the embodiments, the invention provides faster voltage translation, balanced signal output, and lower power consumption with respect to signals output from the core of an integrated circuit that may be operating at less than the voltage of adjacent or external circuits.

The individual attributes and the combination of the attributes of the disclosed invention provide an apparatus and method for tighter control in design of the I/O buffer output rise-to-fall slew rate, rise-to-fall delay differences, and therefore, duty cycle, and an overall reduced delay through the level shifting pre-drive to the output. The reduction in sizes of transistors of the level-shifting stage reduces power consumption in the level-shifter stage and in the core logic that interfaces with the resulting smaller level-shifters and reduced core logic transistors. The faster and balanced output buffer disclosed can be operated at a higher operating frequency than that of the related art.

While preferred embodiments of the present invention have been disclosed and described in detail herein, it will be obvious to those skilled in the art that various changes in form and detail may be made therein without departing from the spirit and scope thereof. For example the level-shifters of the level-shifting stage might be implemented by circuits other than latched cross-wired transistors as in the disclosed embodiments. As a further example, the logical combining circuits (e.g., "NAND" and "NOR") of the second predrive stage might be replaced with combinations of other logical operations such as "AND," "OR," "XOR," "XNOR" and variations of these. Also, the number of signal inputs to the logical combining circuit (NAND-NOR) might be increased to more than two (e.g., DATIN and OENBAR) signals, wherein the invention disclosed herein would still be employed advantageously where at least one such signal is level-shifted. Additional transistor elements might be added in line with or in parallel to those transistors depicted in the figures depicting embodiments of the invention, without materially departing from the inventive circuit. For example, a person reasonably skilled in the art of IC design might see fit to add resistors (such as 384, 385, 484, 485) for falling and rising transition control. Also, transistors gated by supply voltage (i.e., always on), might be added as a conventional remedy to reduce "hot-e" effects in particular circuit designs.

We claim:

1. An output buffer circuit comprising:
    an input stage receiving a data signal, wherein the input stage includes a data signal voltage level shifter, and the data signal voltage level shifter outputs a voltage shifted data signal on a data signal path out of the input stage;
    a first predrive stage including a first buffer being operatively driven by the voltage shifted data signal and including a second buffer being operatively driven by the voltage shifted data signal;
    a second predrive stage comprising a signal combining circuit, said second predrive stage operatively driven by each output of the first and second buffers of the first predrive stage; and
    an output driving stage operatively driven by an output of the second predrive stage.

2. The output buffer circuit of claim 1, wherein the data signal received by the input stage has a logic voltage less than or equal to a logic voltage of the output driving stage.

3. The output buffer circuit of claim 1, wherein said first predrive stage further comprises two or more signal voltage level shifters.

4. The output buffer circuit of claim 1, wherein said data signal voltage level shifter includes cross-wired transistors.

5. The output buffer circuit of claim 1, wherein each of the first buffer and the second buffer of said first predrive stage comprises an inverting buffer.

6. The output buffer circuit of claim 1, wherein the voltage shifted data signal is the logical complement of the data signal, and each of the first buffer and the second buffer is an inverting buffer.

7. The output buffer circuit of claim 1, wherein the input stage, the first predrive stage, the second predrive stage, and the output driving stage are implemented using complementary metal oxide semiconductor (CMOS) transistors.

8. The output buffer circuit of claim 1, wherein the signal combining circuit comprises a first logic gate being operatively driven by the first buffer, and a second logic gate being operatively driven by the second buffer.

9. The output buffer circuit of claim 8, wherein said input stage further receives an output-enabling signal, and further comprises an output-enabling signal voltage level shifter, and outputs a level shifted output-enabling signal.

10. The output buffer circuit of claim 1, wherein the output driving stage is adapted to enter a high impedance state when not enabled to drive said data signal out.

11. The output buffer circuit of claim 9, wherein the first logic gate is further operatively driven by one of the level shifted output-enabling signal and the logical complement of the level shifted output-enabling signal, and the second logic gate is further operatively driven by the other one of the level shifted output-enabling signal and the logical complement of the level shifted output-enabling signal.

12. The output buffer circuit of claim 1, wherein an input buffer is operatively coupled to the output node of output driving stage.

13. The output buffer circuit of claim 1, wherein each of the first buffer and the second buffer of the first predrive stage comprises an inverter including:
    a first transistor referenced to a first voltage, said first transistor comprising a p-channel field effect transistor (PFET); and
    a second transistor referenced to ground, said second transistor comprising an n-channel field effect transistor (NFET).

14. An interface circuit for translating a lower-voltage-logic signal into a higher-voltage-logic signal, comprising:
    a level-shifter operatively driven by said lower-voltage-logic signal;
    two tuning inverters, each of the two tuning inverters being operatively driven by the same output of said level-shifter;
    a signal combining circuit operatively driven by an output from each one of said two tuning inverters, said signal combining circuit being adapted to tristate the output of the interface circuit; and
    an output driving circuit operatively driven by said signal combining circuit, said output driving circuit being adapted to drive said higher-voltage-logic signal out of the interface circuit.

15. The interface circuit of claim 14, wherein each signal combining circuit is further operatively driven by an output-enable signal.

16. The interface circuit of claim 14, wherein the output driving circuit includes a PFET stacked on an NFET, and wherein each of the two tuning inverters is tuned so that when the output driving circuit is switching, the PFET turns OFF before NFET turns ON.

17. The output buffer circuit of claim 1, wherein each of the voltage level shifter and the first buffer and the second buffer is sized so that the data signal will propagate through the output buffer circuit faster than if the output buffer circuit were operably constructed without the first buffer and the second buffer.

18. The output buffer circuit of claim 8, wherein the first logic gate is a NAND-gate, and the second logic gate is a NOR-gate.

19. An interface circuit for translating a data signal from a lower-voltage-logic to a higher-voltage-logic, the circuit comprising:
- a first voltage level shifter including cross-wired transistors, and the first voltage level shifter being operatively driven by said data signal being received as a lower-voltage-logic signal, the first voltage level shifter outputting a level-shifted complemented data signal, the level-shifted complemented data signal being the logical complement of the data signal level-shifted to the higher-voltage-logic;
- a first tuning inverter, being operatively driven by said level-shifted complemented data signal;
- a second tuning inverter, being operatively driven by said level-shifted complemented data signal;
- a signal combining circuit operatively driven by the output of the first tuning inverter and by the output of the second tuning inverter, said signal combining circuit being adapted to control a tristate output driving circuit of the interface circuit; and
- the tristate output driving circuit being adapted to drive the said data signal out of the interface circuit at the higher-voltage-logic.

20. The interface circuit of claim 19, wherein signal combining circuit includes a NAND-gate being operatively driven by the output of the first tuning inverter and further includes a NOR-gate being operatively driven by the output of the second tuning inverter.

\* \* \* \* \*